United States Patent [19]
Yun

[11] Patent Number: 5,838,509
[45] Date of Patent: Nov. 17, 1998

[54] DATA DETECTION LEVEL ADJUSTING CIRCUIT FOR PROCESSING SIGNAL IN DISK DRIVING APPARATUS

[75] Inventor: Jong-Yun Yun, Suwon, Rep. of Korea

[73] Assignee: SamSung Electronics Co., Ltd., Suwon, Rep. of Korea

[21] Appl. No.: 589,565

[22] Filed: Dec. 26, 1995

[30] Foreign Application Priority Data

Dec. 24, 1994 [KR] Rep. of Korea ................. 1994-36630

[51] Int. Cl.$^6$ ....................................................... G11B 5/09
[52] U.S. Cl. ............................................. 360/46; 360/49
[58] Field of Search ................................ 360/40, 46, 49, 360/77.08

[56] References Cited

U.S. PATENT DOCUMENTS

| | | | |
|---|---|---|---|
| 4,562,549 | 12/1985 | Tanaka et al. | 364/486 |
| 4,686,586 | 8/1987 | Dutcher | 360/46 |
| 4,771,188 | 9/1988 | Cheng et al. | 307/351 |
| 5,003,408 | 3/1991 | Farkas et al. | 360/51 |
| 5,128,629 | 7/1992 | Trinh | 330/129 |
| 5,150,050 | 9/1992 | Genheimer et al. | 324/212 |
| 5,287,063 | 2/1994 | Izawa | 324/601 |
| 5,287,227 | 2/1994 | Cronch et al. | 360/45 |
| 5,293,275 | 3/1994 | Kawasaki | 360/51 |
| 5,305,157 | 4/1994 | Wada et al. | 360/53 |
| 5,368,011 | 11/1994 | Tollum | 360/46 |
| 5,436,771 | 7/1995 | Yun | 360/65 |
| 5,440,433 | 8/1995 | Yun | 360/46 |
| 5,452,147 | 9/1995 | Yamashita et al. | 360/46 |

*Primary Examiner*—W. R. Young
*Assistant Examiner*—Regina Y. Neal
*Attorney, Agent, or Firm*—Robert E. Bushnell, Esq.

[57] ABSTRACT

A circuit for variably adjusting a data detection level for processing a read signal picked-up from a magnetic disk. The circuit includes a pulse detecting unit for detecting an amplitude peak of a read signal picked-up from the magnetic disk, comparing the read signal with a preset data detection level, and detecting an amplitude peak corresponding to real data among the detected amplitude peaks as output data; a dynamic detection level generating unit for generating a dynamic detection level voltage having a level varying in correspondence with a level of the read signal; a fixed detection level generating unit for generating a fixed detection level voltage having a preset constant level; an interval detecting unit for detecting from data detected by the pulse detecting unit an interval where a transducer head is positioned on the magnetic disk and discriminating a servo information interval and a data information interval; and a switch unit for selecting one of outputs of the fixed detection level generating unit and the dynamic detection level generating unit in correspondence with an interval detected by the interval detecting unit and providing the selected voltage as a data detection level.

22 Claims, 7 Drawing Sheets

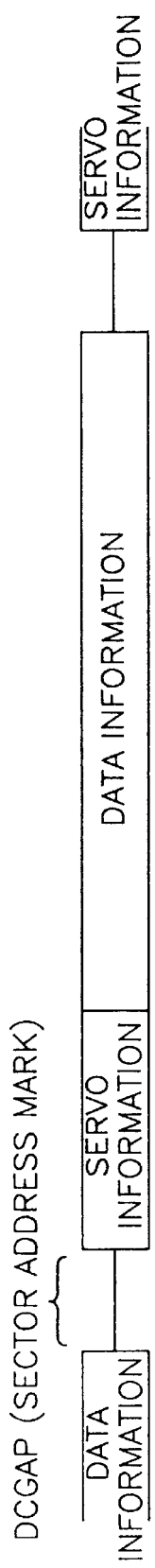
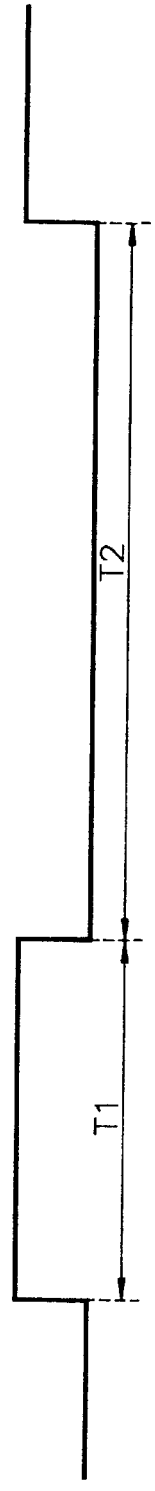
FIG. 5A
FIG. 5B
FIG. 5C
FIG. 5D

DATA DETECTION LEVEL ADJUSTING CIRCUIT FOR PROCESSING SIGNAL IN DISK DRIVING APPARATUS

CROSS-REFERENCE TO RELATED APPLICATIONS

This application makes reference to, incorporates the same herein, and claims all benefits accruing under 35 U.S.C. §119 from an application for *Data Detection Level Adjusting Circuit For Processing Signal In Disk Driving Apparatus* earlier filed in the Korean Industrial Property Office on 24 Dec. 1994 and assigned Ser. No. 36630/1994.

BACKGROUND OF THE INVENTION

1. Technical Field

The present invention relates to a circuit for detecting data from a reproduced signal picked-up from a magnetic disk surface in a disk driving apparatus, and particularly to a circuit for variably adjusting a data detection level in order to detect recorded data.

2. Background Art

In general, a disk driving apparatus such as a hard disk drive and a floppy disk drive has been widely used as an auxiliary memory device in a computer system. Disk driving apparatus records data on a hard disk or a floppy disk for example, and then reads the recorded data. In reading the recorded data, a signal picked up by a transducer head of the disk driving apparatus is hysteresis-compared with a predetermined data detection level in a read processing circuit, in order to detect the recorded data.

In such a conventional read processing circuit, an analog signal picked up from a disk by read heads of a disk driving apparatus is typically amplified, filtered, and simultaneously applied to a differentiator and rectifier circuit. The rectifier circuit detects the voltage level of a signal by full-wave rectifying the filtered signal and the voltage level detected is applied to automatically control gain control gain of a control amplifier. The differentiator detects the peak value of the signal by differentiating the filtered signal. A pulse signal is generated in response to the peak value detected by the differentiator. The differentiator may, however, undesirably provide false output data when, for example, the filtered signal contains noise. In order to prevent output of false output and to restrict detection to only data exhibiting the peak value, the differential comparator hysteresis-compares the filtered signal with a predetermined data detection level SETHYS provided by a data detection level adjusting circuit. A differential amplifier generates a signal in response to the filtered signal. A flip-flop generates a signal by latching the output signal from the differential comparator at a rising edge of the signal generated from the first bidirectional monostable multivibrator. Then, a second bidirectional monostable multivibrator is triggered at the rising and falling edges of the signal provided by the flip-flop to produce a pulse signal. When comparing the filtered signal with the pulse signal, only the peak value is detected. Hence, the pulse signal generated from the second bidirectional monostable multivibrator is produced as encoded data.

Typically, the analog signal picked up by the heads varies depending upon operating circumstances such as the interference, impact, noise of the signal, and the like. In particular, as the capacity of the disk increases, the recording information of the disk is highly packed. Moreover, as the number of tracks increases, the analog signal reproduced is severely susceptible to variation. Consequently, if the data detection level is inappropriately set, data errors are generated. That is, if the data detection level is set too high, loss of data may occur. If, on the other hand, the data detection level is set too low, noise may be mistaken for data. Thus, in consideration of the variation of the signal, the data detection level must be set to an appropriate value by the data detection level adjusting circuit.

Conventionally, the data detection level is generated from the data detection level adjusting circuit at a fixed level for each disk driving apparatus. The data detection level is typically adjusted to an appropriate data detection level by selecting different resistances of a voltage divider. However, different resistances must be selected for different disk driving apparatuses during the manufacture of such disk driving apparatuses. Hence, each disk driving apparatus must be modified in its hardware to accommodate a fixed data detection level. Once the data detection level is fixed for each disk driving apparatus, it is difficult to prevent the data error caused by the variation of the signal according to the position of the disk, or operating circumstances.

In order to solve such disadvantages, a data processing technique disclosed in Korea Patent Application No. 92-22630 assigned to the same assignee of the present invention, provides selection of three different predetermined data detection levels such that, during a test process when manufacturing the disk driving apparatus, the data detection level may be varied in response to the area of the disk and to a servo or a data information interval in which an error occurs may be mapped to a defect list. This way, any data error caused by the defect of the disk may be prevented. However, Korean Patent Application No. 92-22634 requires that the hardware must be modified as a function of each disk driving apparatus because the data detection level is fixed. Further, it has been my observation that it is difficult to prevent the data error caused by the variation of the analog signal according to the position of the disk or operating circumstances.

Other data detection level adjusting circuits such as disclosed, for example, in U.S. Pat. No. 5,150,050 for *Adaptive Variable Threshold Qualification Level Circuit For Signal Processing In Disk Drives* issued to Genheimer, and U.S. Pat. No. 5,287,227 for *Track Dependent Variable Level Qualification Pulse Detector* issued to Cronch et al., are capable of adjusting the data detection level during the reading of the recorded data signal from a magnetic disk with respect to respective tracks. However, they require the manufacturer to first map all media defects during the manufacturing test process of a magnetic disk drive and store the mapped errors into a memory. Moreover, it has been my observation that in these circuits, the data detection level signal is, in essence, a constant value relative to each track.

A more recent, effective technique for adjusting the data detection level in a read processing circuit is disclosed in U.S. patent application Ser. No. 08/126,718 for *Circuit And Method For Adjusting A Data Detecting Level Of A Disk Driving Apparatus* which I filed on Sep. 27, 1993, and since issued as U.S. Pat. No. 5,440,433. In that disclosure, I reveal an improved data detection level adjusting circuit capable of preventing data error by adaptively adjusting a data detection level in accordance with operating circumstances of the magnetic disk surface such as noise, interference, impact and alike without modifying the hardware in a disk driving apparatus. The data detection level is adjusted based upon an average value of its maximum and minimum level values determined during the read test to the extent that data error does not occur. While my earlier improved data detection level adjusting circuit has its own merit, it has since been my continuing observation that data error may still occur when the data detection level is obtained without discriminating the inner and outer peripheries of the magnetic disk. Further, it has also been my observation that, when the data detection level is set and the level of the analog signal picked-up from the disk surface is temporarily changed, the data error may still occur.

SUMMARY OF THE INVENTION

Accordingly, it is therefore an object of the present invention to provide an improved data detecting level adjusting circuit capable of preventing data error in a disk driving device.

It is another object of the present invention to provide an improved data detecting level adjusting circuit for adaptively adjusting a data detection level in accordance with different intervals arranged in each track and operational circumstances of a magnetic disk such as noise, interference, impact and alike.

It is still another object of the present invention to provide an improved data detection level adjusting circuit for variably adjusting a data detection level adaptively in accordance with inner and outer peripheries and operational circumstances of a magnetic disk, in order to prevent generation of data error.

These and other objects may be achieved with an improved data detection level adjusting circuit for adjusting a data detection level to process a read signal in a disk driving device. The data detection level adjusting circuit includes a pulse detection unit for detecting an amplitude peak of a read signal reproduced from a magnetic disk, comparing the read signal with a data detection level, and detecting an amplitude peak corresponding to true data among the detected amplitude peaks as output data; a dynamic detection level generation unit for generating a dynamic detection voltage level varying in accordance with a level of said read signal; a fixed detection level generation unit for generating a fixed detection voltage level having a preset value; an interval detection unit for detecting from said output data detected by the pulse detection unit an interval where a transducer head is positioned on the magnetic disk and for discriminating a servo information interval and a data information interval for each track; and a switch for selecting the fixed detection voltage level as the data detection level when the interval detection unit detects the servo information interval in each track and selecting the dynamic detection voltage level as the data detection level when the interval detection unit detects the data information interval as the data detection level. The fixed detection level generation unit typically includes a microprocessor having a memory storing a plurality of preset levels corresponding to a number of tracks in the magnetic disk, for generating a pulse width modulation signal having a duty cycle corresponding to a preset level selected from the plurality of preset levels, as the duty cycle varies from track to track when the transducer head transverses across the magnetic disk; and a filter circuit for low-pass filtering the pulse width modulation signal to generate the fixed detection level voltage for each track.

The present invention is more specifically described in the following paragraphs by reference to the drawings attached only by way of example.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein:

FIGS. 5A to 5D are timing diagrams illustrating an operation of the read processing circuit of FIGS. 3 and 4;

DETAILED DESCRIPTION OF THE PREFERRED EMBODIMENT

Figure 1:
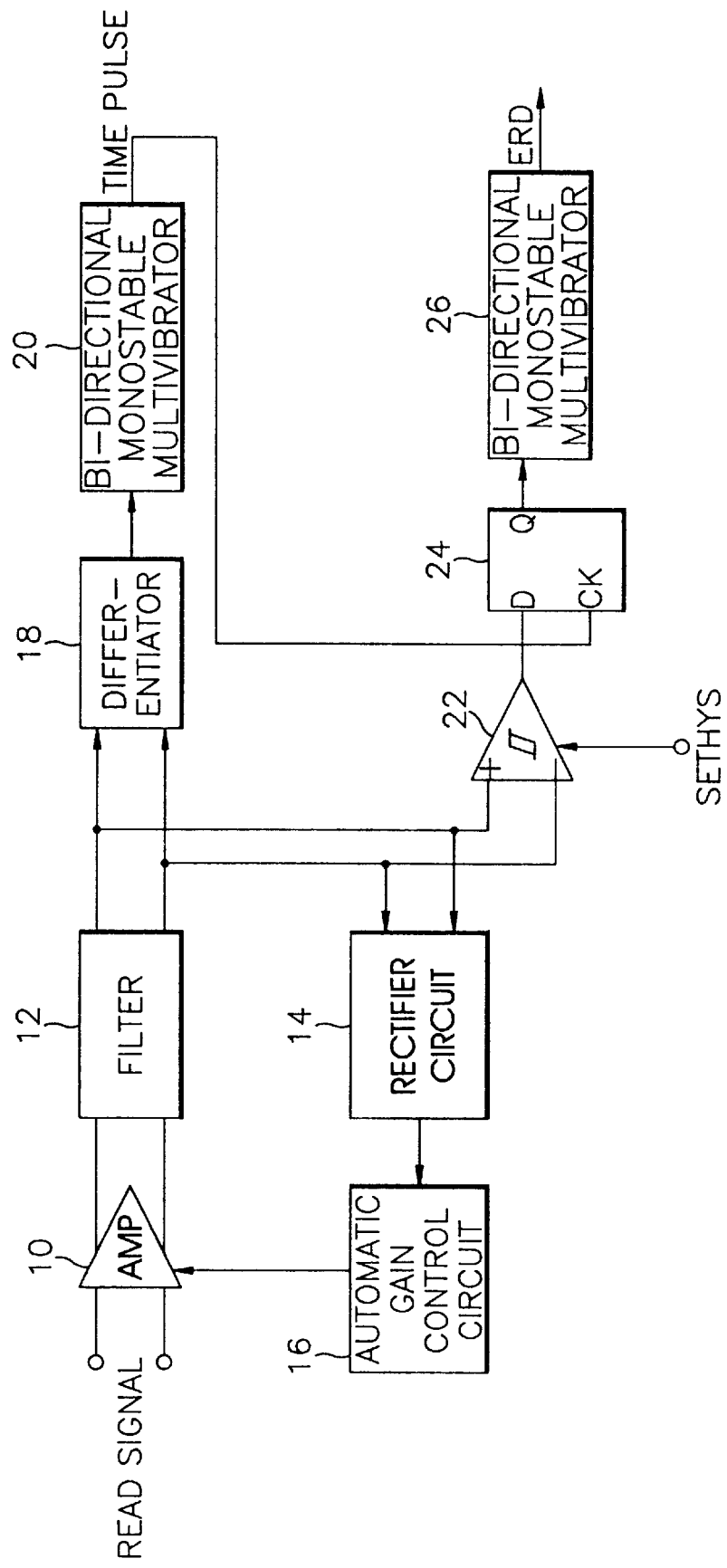
FIG. 1 illustrates a conventional read processing circuit of a disk driving apparatus.

Referring now to the drawings and particularly to FIG. 1, which illustrates a conventional read processing circuit for a disk driving apparatus. An integrated circuit, such as a read processor or commonly known as data pulse detector "DP8464" manufactured by the National Semiconductor in the United States may be used in connection with a gain control amplifier 10, a filter 12, a differentiator 18, first and second bidirectional monostable multivibrators 20 and 26, a differential comparator 22, a flip-flop 24, a rectifier circuit 14 and an automatic gain control circuit 16. FIGS. 2A to 2E are timing diagrams illustrating an operation of the read processing circuit of FIG. 1.

Figure 2:
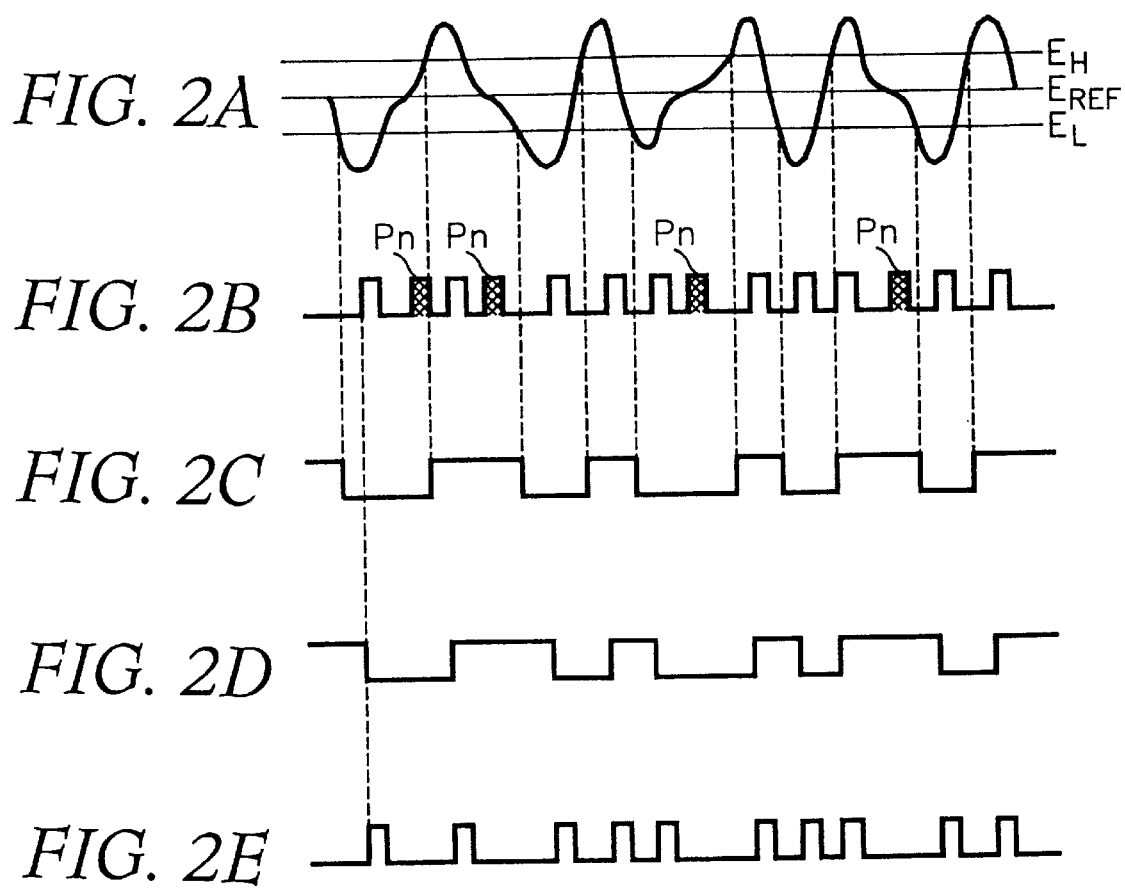
FIGS. 2A to 2E are timing diagrams illustrating an operation of the read processing circuit of FIG. 1.

A data detection operation will now be described with reference to FIGS. 1 and 2. An analog signal picked up from a disk by read heads (not shown) a disk driving apparatus is preamplified in a pre-amplifier (not shown) and further gain control amplified in the gain control amplifier 10. Thereafter, the signal passing through the filter 12 is simultaneously applied to the differentiator 18, the differential comparator 22 and the rectifier circuit 14. The waveform chart of the output signal of the filter 10 is illustrated in FIG. 2A. The rectifier circuit 14 detects the voltage level of a signal by full-wave rectifying the output signal of the filter 12 and supplies the detected voltage level to the automatic gain control circuit 16. The automatic gain control circuit 16 controls the gain of the gain control amplifier 10 appropriately in response to the voltage level detected from the rectifier circuit 14. The differentiator 18 detects the peak value of the signal by differentiating the output signal of the filter 12. The first bidirectional monostable multivibrator 20 generates a pulse signal as shown in FIG. 2B in response to the peak value detected from the differentiator 18. In this time, the differentiator 18 may generate false output in a form of noise pulses Pn as shown in FIG. 2B when noise is contained in the output signal of the filter 12. In order to prevent false output and detect only data of the peak value, the differential comparator 22 hysteresis-compares the output signal of the filter 12 with a predetermined data detection level generated from a data detection level adjusting circuit (not shown) in a form of a hysteresis level SETHYS. This hysteresis level SETHYS represents a reference voltage level $E_{REF}$ as shown in FIG. 2A, and is capable of being adjusted to $E_H$ to $E_L$. The differential amplifier 22 generates a signal as shown in FIG. 2C in response to the output signal of the filter 12. The flip-flop 24 generates a signal as indicated in FIG. 2D by latching the output signal of the differential comparator 22 at a rising edge of the signal generated from the first bidirectional monostable multivibrator 20. Then the second bidirectional monostable multivibrator 26 is triggered at the rising and falling edges of the signal generated from the flip-flop 24, to produce a signal as shown in FIG. 2E. When comparing the pulse signal shown in FIG. 2E with the signal shown in FIG. 2A, only the peak value is detected. Hence, the pulse signal generated from the second bidirectional monostable multivibrator 26 is produced as encoded data ERD as shown in FIG. 2E.

Typically, the amplitude of the signal picked up from the same track of the magnetic disk surface is not constant and may vary at different intervals such as, for example, a servo information interval and a data information interval reciprocally arranged cylindrically in each sector of each track. The servo information interval serves as an interval containing writing information of a head position such as, for example, track position information, a track address, index information, and seek information. A sector address mark is written as one of the servo information in a form of a direct current gap in order to discriminate various sectors in the servo information interval. The data information interval, on the other hand, serves as an interval in which real data information is written.

Generally, a guard band exists between tracks in the data information interval in order to prevent interference of the data information of each track. However, there is no guard band between tracks in the servo information interval. Servo information is successively written in the servo information interval. This is because if guard band exists between tracks in the servo information, interval, the transducer head may fail to read the seek information when seeking the track. By contrast, if the guard band does not exist in the data information interval, interference may occur in the data information read from adjacent tracks. Therefore, when the head reads the information written on the magnetic disk surface, the servo information is magnetized by being spread widely with no blank space on the track while the data information is magnetized by being spread narrowly on the portion except for the guard band. Therefore, the amplitude of the signal picked up by the head is different due to different servo and data frequencies when reading the data formation interval and the servo information interval. As a result, the data detection level in the servo information interval and the data information interval should be set at different levels.

The signal picked-up by the head varies depending upon operational circumstances such as, for example, the interference of the signal, impact, noise and the like. In particular, as the capacity of the disk increases, the recording information of the disk is highly packed. Similarly, as the number of tracks increases, the signal varies significantly. Moreover, since the height of the head from the magnetic disk surface is not constant as the head floats over the inner periphery, namely, an inner track, and the outer periphery, namely, an outer track of the magnetic disk, it has been my observation that the amplitude of the signal picked-up by the head also varies depending upon the position of the head over the magnetic disk. This is attributed to the fact the reading density of the inner track is higher than that of the outer track; consequently, the amplitude of the signal picked-up in the inner track is lower than that of the signal picked-up in the outer track. Therefore, if the data detection level is improperly set, the data error is generated. That is, if the data detection level is set too low, noise may be generated as the data. If, on the other hand, the data detection level is set too high, real data may be lost. Thus, in consideration of the variation of the signal picked-up by the head, the data detecting level must be set to an appropriate level in order for the read processing circuit to produce true data without data error.

As described earlier, my earlier attempt to set an appropriate data detection level for processing the signal picked-up from the magnetic disk is disclosed in the co-pending U.S. patent application Ser. No. 08/126,718 for *Circuit And Method For Adjusting A Data Detecting Level Of A Disk Driving Apparatus* which I filed on Sep. 27, 1993, and since issued as U.S. Pat. No. 5,440,433. In that patent reference, I disclose an improved data detection level adjusting circuit capable of preventing data error by adaptively adjusting a data detection level in accordance with operating circumstances of the magnetic disk surface such as noise, interference, impact and alike without modifying the hardware in a disk driving apparatus. The data detection level is adjusted based upon an average value of its maximum and minimum level values determined during the read test to the extent that data error does not occur. While my earlier improved data detection level adjusting circuit contributes significantly to the signal processing art, it has since been my observation that data error may still occur when the data detection level is obtained without discriminating the inner and outer peripheries of the magnetic disk surface. Further, it has also been my observation that, when the data detection level is set and the level of the analog signal picked-up from the disk surface is temporarily changed, the data error may still occur. For this reason, I have constructed another improved data detection level adjusting circuit intended to address the above identified deficiencies.

Figure 3:
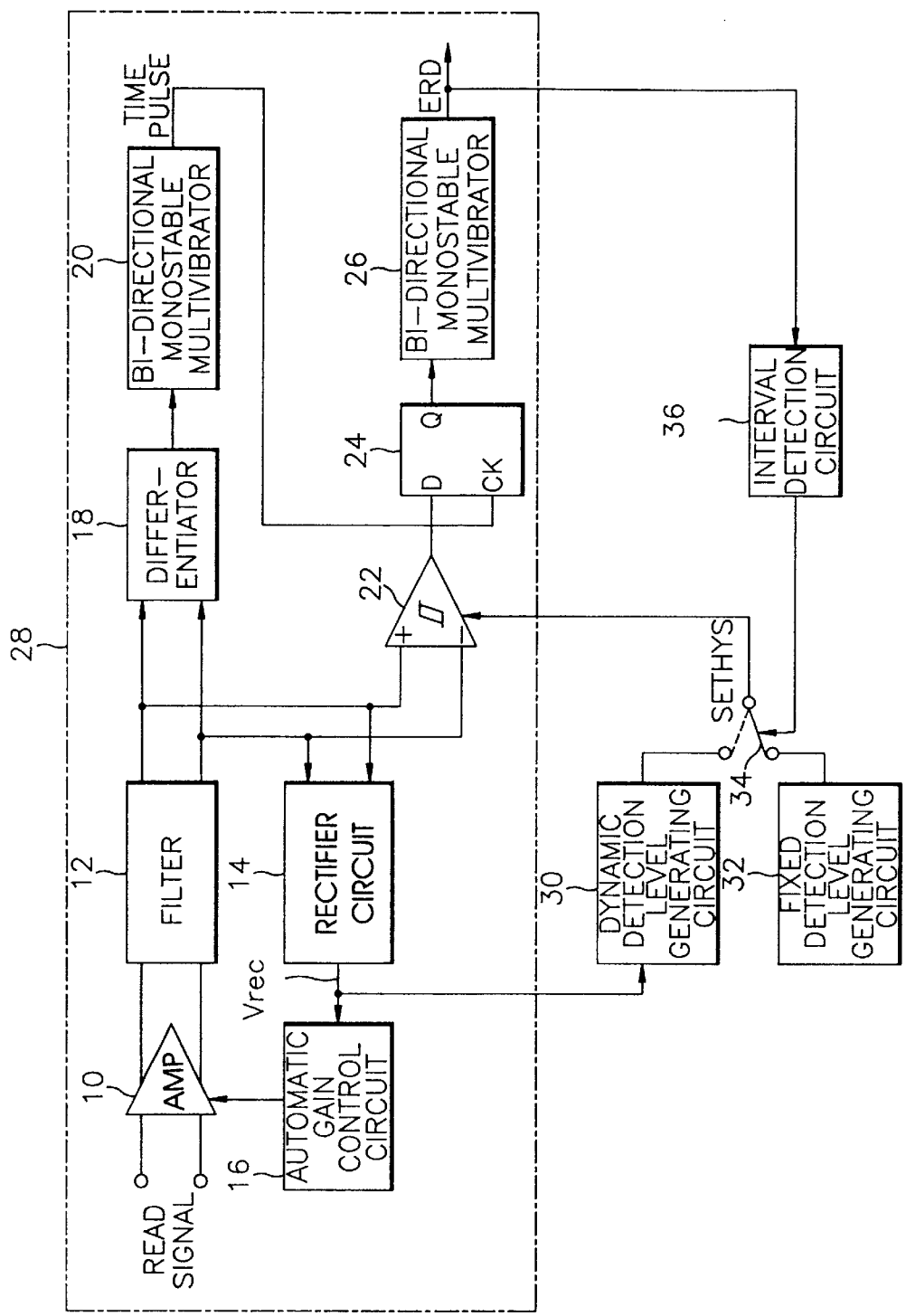
FIG. 3 illustrates a data detection level adjusting circuit incorporated into a read processing circuit as constructed according to one embodiment of the present invention.

Turning now to FIG. 3 which illustrates an improved data detection level adjusting circuit incorporated into a read processing circuit as constructed according to a preferred embodiment of the present invention. As shown in FIG. 3, the read processing circuit 28 is essentially the same as that shown in FIG. 1 for detecting an amplitude peak of an analog read signal picked-up from a magnetic disk, comparing the analog read signal with a predetermined data detection level SETHYS, and detecting the amplitude peak corresponding to real data among the amplitude peaks. That is, the read processing circuit 28 is constructed by a gain control amplifier 10, a filter 12, a differentiator 18, first and second bidirectional monostable multivibrators 20 and 26, a differential comparator 22, a flip-flop 24, a rectifier circuit 14, and an automatic gain control circuit 16. The improvements reside in the construction of a data detection level adjusting circuit and the way in which the data detection level adjusting circuit is incorporated into the read processing circuit 28.

The data detection level adjusting circuit as constructed according to the principles of the present invention includes a dynamic detection level generating circuit 30, a fixed detection level generating circuit 32, an interval detection circuit 36, and an analog switch 34 for generating the appropriate data detection level. The dynamic detection level generating circuit 30 is connected to an output terminal of the rectifier circuit 14 of the read processing circuit 28, for generating a dynamics detection level voltage having a variable level from an output voltage Vrec in correspondence with the level of the analog read signal. The fixed detection level generating circuit 32 generates a fixed detection level voltage having a preset constant level. The interval detection circuit 36 is connected to the encoded data ERD output from the read processing circuit 28, for detecting from the encoded data ERD an interval in which the transducer head is positioned on the magnetic disk, and for discriminating a servo information interval and a data information interval in each sector of each track of the magnetic disk. The analog switch 34 selects one of outputs of the dynamic detection level generating circuit 30 and the fixed detection level generating circuit 32 in correspondence with the interval detected by the interval detection circuit 36 and provides the selected output as the data detection level SETHYS to a hystersis comparator 22 of the read processing circuit 28. The analog switch 34 selects the fixed detection level voltage as the data detection level SETHYS for transmission to the read processing circuit 28, when the present interval of each track of the magnetic disk is detected by the interval detection circuit 36 as the servo information interval. By contrast, the analog switch 34 selects the dynamic detection level voltage as the data detection level SETHYS for transmission to the read processing circuit 28, when the present interval of each track of the magnetic disk is detected by the interval detection circuit 36 as the data information interval.

Figure 4:
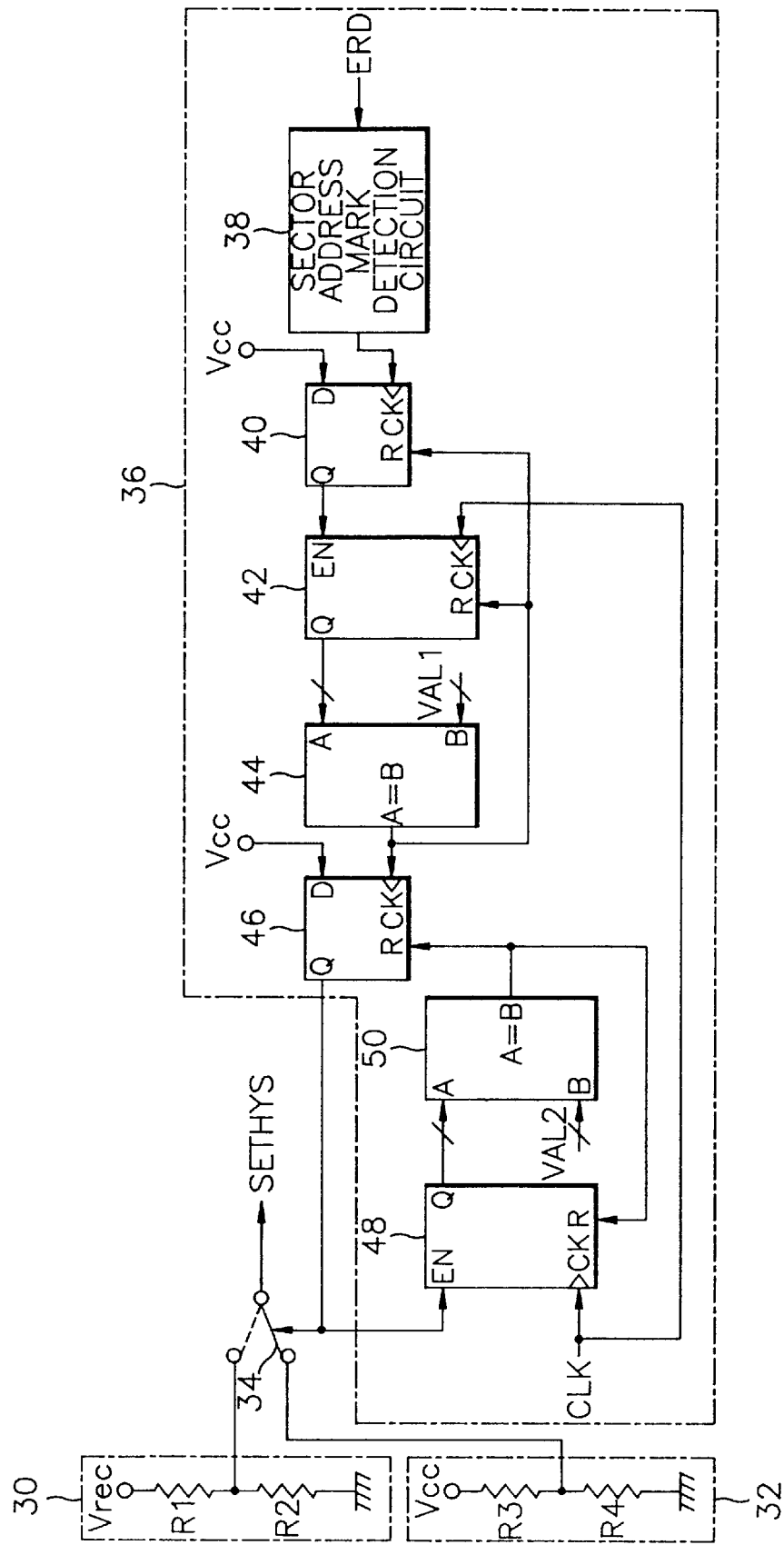
FIG. 4 illustrates a detailed circuit diagram of a data detection level adjusting circuit of FIG. 3.

FIG. 4 illustrates a detailed circuitry of the data detection level adjusting circuit of FIG. 3. As shown in FIG. 4, the dynamic detection level generating circuit 30 is comprised of resistances R1 and R2 which constantly separate an output voltage Vrec of the rectifier circuit 14 for output as the dynamic detection level voltage. The dynamic detection level voltage has a data qualification level that varies in correspondence with the output level of the rectifier circuit 14. The fixed detection level generating circuit 32 is comprised of resistances R3 and R4 which constantly separate a voltage Vcc for output as the fixed detection level voltage. The fixed detection level voltage always has a data qualification level at a constant level.

The interval detection circuit 36 is constructed with a sector address mark detection circuit 38 coupled to receive the encoded data ERD output from the read processing circuit 28, flip-flops 40 and 46, counters 42 and 48, and comparators 44 and 50. The sector address mark detection circuit 38 detects a sector address mark from the encoded data ERD generated from the read processing circuit 28, in order to generate a sector address mark detection signal representing a pulse of a logic "high" state. Therefore, each sector in the track of the magnetic disk is recognized by the data detection level adjusting circuit by way of the sector address mark detection signal. The flip-flop 40 latches a power supply voltage Vcc in response to the sector address mark detection signal in order to generate a logic "high" state. After being enabled by the logic "high" state of the flip-flop 40, the counter 42 counts a pulse of a clock signal CLK and outputs count data. The clock signal CLK is a signal separated from the encoded data ERD and is synchronized with the encoded data ERD. The comparator 44 compares the count data of the counter 42 with a preset first interval value VAL1. At this time, if the count data is different from the preset first interval value VAL1, the comparator 44 outputs the logic "low" state. If, on the other hand, the count data is the same as the preset first interval value VAL1, the comparator 44 generates the logic "high" state to the flip-flop 46. Since the output of the comparator 44 becomes the logic "high" state, the flip-flop 46 latches the power supply voltage Vcc and outputs the logic "high" state signal to the analog switch 34 and the counter 48. After being enabled by the logic "high" state of the flip-flop 46, the counter 48 counts the pulse of the clock signal CLK and outputs the count data. The comparator 50 compares the data count of the counter 48 with a preset second interval value VAL2. When the data count of the counter 48 is different from the preset second interval value VAL2, the comparator 50 outputs a logic "low" state. When the data count of the counter 48 is the same as the preset second interval value VAL2 under the output of the logic "low" state, the comparator 50 generates a logic "high" state and resets the flip-flop 46 and the counter 48.

When the logic "high" state from the interval detection circuit 36 is applied, the analog switch 34 selects the fixed detection level voltage as the data detection level SETHYS. By contrast, when the logic "low" state is applied, the analog switch 34 selects the dynamic detection level voltage as the data detection level SETHYS.

FIGS. 5A to 5D are timing diagrams illustrating an operation of the read processing circuit of FIGS. 3 and 4. FIG. 5A shows a data written format written on the magnetic disk, where a direct current (DC) gap is written as the sector address mark. FIG. 5B illustrates an output wave form of the sector address mark detection circuit 38, where the sector address mark detection signal is generated whenever the DC gap is detected. FIG. 5C illustrates an output wave form of the comparator 44, where the pulse of the logic "high" state is output whenever every servo information interval is detected. FIG. 5D illustrates an output wave form of the flip-flop 46, in which the logic "high" state is generated during a servo information interval T1 including the DC gap, and the logic "low" state is generated during a data information interval T2.

An operation of the data detection level adjusting circuit incorporated into the read processing circuit of FIGS. 3 and 4 will now be described in detail with reference to FIGS. 5A to 5D. First of all, it should be noted that the production of the encoded data ERD by the read processing circuit 28 from the analog signal picked-up from on the magnetic disk is the same as that described with reference to FIG. 1. The interval detection circuit 36 generates a signal discriminating the servo information interval and the data information interval from the encoded data ERD. First, the sector address mark detection circuit 38 detects the sector address mark having the DC gap form as shown in FIG. 5A from the encoded data ERD generated from the read processing circuit 28, and generates the pulse of the logic "high" state as shown in FIG. 5B as the sector address mark detection signal upon detection of the sector address mark. Thus, each sector in a track is recognized by the interval detection circuit 36 by way of the sector address mark detection signal.

The flip-flop 40 then latches the power supply voltage Vcc of a data input terminal D in response to the sector address mark detection signal received at a clock terminal CK and generates a logic "high" state signal to an enable terminal EN of the counter 42, for enabling operation of the counter 42. As a result, the counter 42 starts counting the pulse of the clock signal CLK and outputs the count data according to the counting thereof. At this moment, the comparator 44 compares the count data with a preset first interval value VAL1. When the count data is different from the preset first interval value VAL1, the comparator 44 outputs the logic "low" state signal. However, when the count data is the same as the preset first interval value VAL1 under the output of the logic "low" state, the comparator 44 outputs the logic "high" state signal. Thus, the first interval value VAL1 is set as a value corresponding to an interval from a point in time when the sector address mark is detected to a point in time when the data information interval is ended. Accordingly, the comparator 44 generates the pulse of the logic "high" state at the point of time when the data information interval is ended as shown in FIG. 5C; that is, at the starting point of the servo information interval. This signal is then used to initiate operation of the flip-flop 40 and the counter 42. Therefore, the flip-flop 40 latches the power supply voltage Vcc of the data input interval D by the pulse of the output logic "high" state of the comparator 44 inputted to the clock terminal CK and commonly outputs the logic "high" state signal to the analog switch 34 and the counter 48. As a result, the analog switch 34 selects the fixed detection level voltage of the fixed detection level generating circuit 32 as the data detection level SETHYS and provides the data detection level SETHYS to the hystersis comparator 22.

In the meanwhile, after being enabled by the logic "high" state of the flip-flop 46, the counter 48 starts counting of the pulse of the clock signal CLK and outputs the count data in accordance with the counting thereof. In this instance, the comparator 50 compares the count data with the preset second interval value VAL2 in order to generate a logic "low" state signal, when the count data is different from the preset second interval value VAL2, and to generate a logic "high" state signal, when the count data is the same as the preset second interval value VAL2 under the output of the logic "low" state. Then, the second interval value VAL2 is set as a value corresponding to an interval from the point in time when the servo information interval is started to the point in time when the servo information interval is ended. Accordingly, the comparator 50 generates the pulse of the logic "high" state at each point in time when the servo information interval is ended. This signal then initiates the flip-flop 46 and the counter 48 by resetting itself. Thus, the output signal of the flip-flop 46 is again applied as the logic "low" state to the analog switch 34. Therefore, the analog switch 34 selects the dynamic detection level voltage of the dynamic detection level generating circuit 30 as the data detection level SETHYS and provides the data detection level SETHYS to the hystersis comparator 22.

By repeating the operations described above, the data detection level SETHYS is provided to the hystersis comparator 22 with different data qualification levels depending upon detection of the servo information interval and the data information interval by the interval detection circuit 36. That is, the analog switch 34 provides the fixed detection level voltage of the fixed detection level generating circuit 32 as the data detection level SETHYS during the servo information interval T1, and provides the dynamic detection level voltage of the dynamic detection level generating circuit 30 as the data detection level SETHYS during the servo information interval T2. Then, the fixed detection level voltage corresponds to a voltage having the constant level by the resistances R3 and R4 and the dynamic detection level voltage corresponds to a voltage of the level varied in correspondence with a level of the analog read signal because the dynamic detection level voltage uses the output voltage Vrec of the rectifier circuit 14.

As a result, during the servo information interval in which the level of the analog read signal picked-up from the disk typically remains invariant, and the data detection level is adaptively set depending upon the strength of the analog read signal, the hystersis comparator 22 of the pulse detector 28 compares the analog read signal with the fixed detection level voltage in order to enable production of the encoded data ERD without data error. By contrast, during the data information interval in which the level of the analog read signal picked-up from the disk surface varies, the data detection level is adaptively varied in accordance with the level of the analog read signal, in order to prevent generation of data error. It should be noted that the analog read signal picked-up from the data information interval has an amplitude relatively larger than the amplitude of the analog read signal picked-up from the servo information interval.

Figure 6:
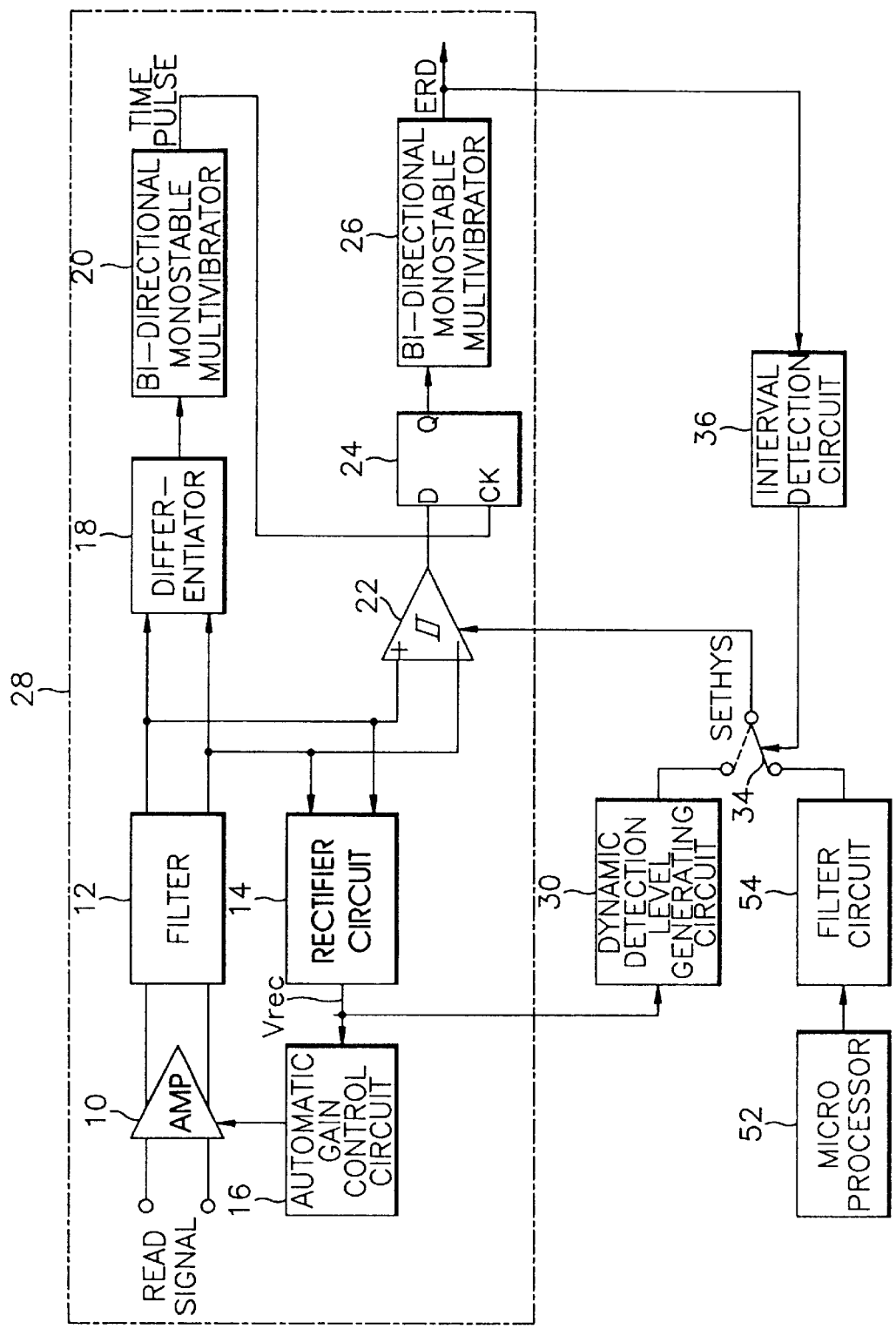
FIG. 6 illustrates a data detection level adjusting circuit incorporated into a read processing circuit as constructed according to another embodiment of the present invention.

FIG. 6 illustrates another data detection level adjusting circuit incorporated into a read processing circuit as constructed according to the principles of the present invention. This particularly circuit is constructed to further compensate for the amplitude variation of the analog read signal picked-up from the disk as the transducer head traverses from tracks to tracks e.g., from the inner tracks to the outer tracks, or from outer tracks to inner tracks. As shown in FIG. 6, the construction of each of the read processing circuit 28, the dynamic detection level generating circuit 30, and the interval detection circuit 36 is the same as those shown in FIGS. 3 and 4. However, the improvement resides in the way in which the fixed detection level is supplied to the analog switch 34. A microprocessor 52 is constructed to generate a pulse width modulation signal exhibiting a variable duty cycle corresponding to a preset level in response to the present read track of the magnetic disk among a plurality of preset levels. That is, the microprocessor 52 generates the pulse width modulation signal PWM at a relatively low duty level in the inner track and at a relatively high duty level in the outer track, respectively. A filter circuit 54 low-filters the pulse width modulation signal PWM output from the microprocessor 52 in order to detect the voltage level and output the voltage level as the fixed detection level voltage to the analog switch 34 for each track. While the voltage output from the filter circuit 54 becomes the fixed detection level voltage at each track, it varies from tracks to tracks as the transducer head traverses across the tracks.

When the interval detection circuit 36 first detects the servo information interval, the analog switch 34 selects the fixed detection level voltage of the filter circuit 54 as the data detection level SETHYS by the output of the interval detection circuit 36 and provides that as the data detection level SETHYS to the hystersis comparator 22. By contrast, when the interval detection circuit 36 detects the data information interval, the analog switch 34 selects the dynamic detection level voltage of the dynamic detection level generating circuit 30 as the data detection level SETHYS and provides that as the data detection level SETHYS to the hystersis comparator 22.

Figure 7:
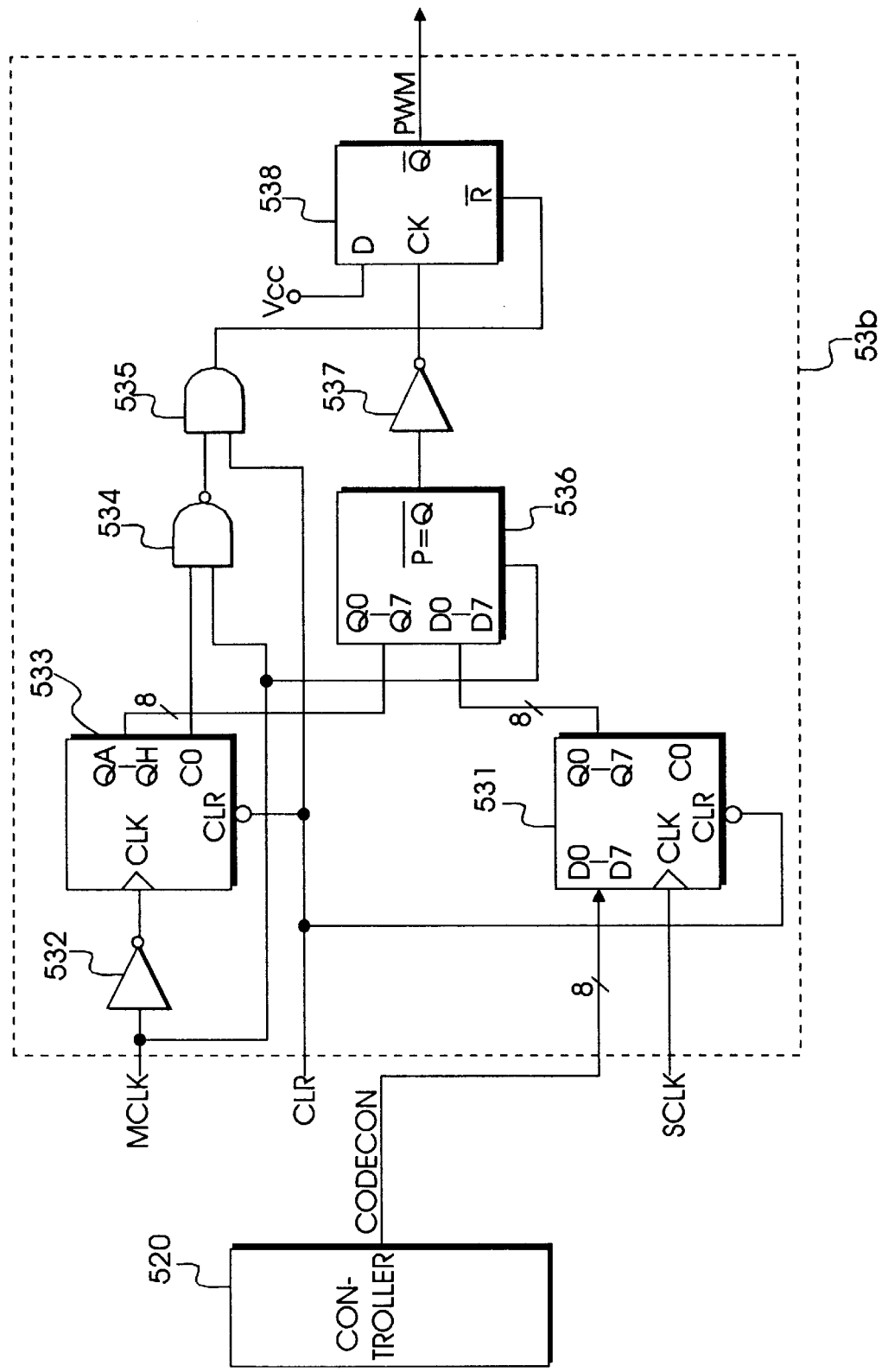
FIG. 7 illustrates an alternative circuit diagram of the microprocessor 52 of FIG. 6.

The microprocessor 52 of FIG. 6 may be constructed by a controller 520 and a pulse width modulation signal generating circuit 503 as shown in FIG. 7. The controller 520 generates level control data CODECON having a predetermined value corresponding to each track of the magnetic disk. The pulse width modulation signal generating circuit 530 generates a pulse width modulation signal PWM having a duty cycle corresponding to the level control data CODECON of the controller 520. Referring to FIG. 7, the level control data CODECON of 8 bits is received and the duty cycle is varied with 256 grades. A latch circuit 531 latches the level control data CODECON received from the controller 520. A counter 533 counts the number of pulses of a clock signal MCLK having a constant frequency of typically 32M applied through an inverter 532 repeatedly to generate count data, and generates a carry signal when the count is ended. The count end signal is applied to a reset terminal "R" of a flip-flop 538 via a NAND gate 534 and an AND gate 535. A comparator 536 compares the level control data CODECON latched to the latch circuit 531 with the count data of the counter 533 and generates a logic "low" state when the level control data CODECON and the count data of the counter 533 are the same. The logic "low" signal of the comparator 536 is applied to the clock terminal CK of the flip-flop 538 through an inverter 537. A supply voltage Vcc is applied to a data terminal "D" of the flip-flop 538. In response to the count end signal of the counter 533, the flip-flop 538 latches a logic "high" caused by the supply voltage Vcc and is set by the logic "low" signal of the comparator 536. The inverted output terminal Q of the flip-flop 538 generates the pulse width modulation signal PWM of which a different logical state is alternatively repeated. For example, if a logic "high" interval and a logic "low" interval are identical to each other in one period, the pulse width modulation signal PWM has a duty cycle of 50%. However, the controller 520 controls the varying of the duty cycle of the pulse width modulation signal PWM so that the pulse width modulation signal has a relatively low duty level in the inner track and at a relatively high duty level in the outer track, respectively.

As described above, the data detection level adjusting circuit as constructed according to the principles of the present invention seeks to prevent undesirable generation of data error in the read processing circuit by adaptively adjusting the data detection level in accordance with the inner and outer peripheries of the magnetic disk.

As apparent from the foregoing, while there have been illustrated and described what are considered to be preferred embodiments of the present invention, it will be understood by those skilled in the art that various changes and modifications, such as a method of discriminating the servo information interval and the data information interval by using the sector address mark, may be made, and equivalents may be substituted for elements thereof without departing from the true scope of the present invention. In addition, many widely different embodiments of the present invention may be utilized by using the other reference signal such as a method of discriminating the servo information interval and the data information interval by using an index signal. Therefore, it is intended that the present invention not be limited to the particular embodiments disclosed as the best mode contemplated for carrying out the present invention, but that the present invention includes all embodiments falling within the scope of the appended claims.

What is claimed is:

1. A circuit for preventing false output when reading data recorded onto a recording medium, comprising:

transducer means for providing an electrical signal upon reading data from said recording medium;

means for providing an amplified signal by amplifying the electrical signal in dependence upon a gain control signal;

means for providing a filtered signal by filtering the amplified signal;

means for generating said gain control signal in dependence upon said filtered signal;

means for detecting peak values of said filtered signal and generating a first pulse signal in dependence upon the peak values;

differential means for differentially comparing said filtered signal with a data detection level to provide a differential signal;

means for latching the differential signal and producing a second pulse signal representative of output data; and means for adaptively adjusting said data detection level to said differential means, said adjusting means comprising:

dynamic detection level generation means for generating a dynamic detection voltage level varying in accordance with an amplitude level of said filtered signal;

fixed detection level generation means for generating a fixed detection voltage level having a predetermined value;

interval detection means coupled to receive said output data, for detecting a servo information interval and a data information interval arranged in each track; and switch means for alternately enabling transmission of said dynamic detection voltage level as said data detection level for the data information interval of each track and transmission of said fixed detection voltage level as said data detection level for the servo information interval of each track.

2. The circuit of claim 1, wherein said dynamic detection level generation means comprises a first resistor interposed between said filter means and an output terminal for producing said dynamic detection voltage level having an amplitude level varying in accordance with the amplitude level of said filtered signal, and a second resistor serially connected to said output terminal and a voltage terminal.

3. The circuit of claim 1, wherein said fixed detection level generation means comprises a serially connected first and second resistors having one terminal end coupled to receive a power source voltage, for generating said fixed detection level having said predetermined value.

4. The circuit of claim 1, wherein said interval detection means comprises:

sector address mark detection means coupled to receive said output data, for detecting a direct current gap indicative of a sector address mark from said output data for each track to generate a sector address mark detection signal;

a first flip-flop for latching a power supply voltage in response to said sector address mark detection signal to generate a first flip-flop signal;

a first counter having a clock terminal coupled to receive a clock signal in synchronization with said output data and a data terminal coupled to receive said first flip-flop signal, for counting said clock signal in response to said first flip-flop signal to generate a first counted signal;

a first comparator for comparing said first counted signal with a first internal value to generate a first comparator signal exhibiting a logic low state when said first counted signal reaches said first internal value and exhibiting a logic high state when said first counted signal does not react said first internal value;

a second flip-flop for latching said power supply voltage in response to said first comparator signal to generate a second flip-flop signal exhibiting a logic high state for enabling said switch means to select said fixed detection voltage level as said data detection level for transmission, and exhibiting a logic low state for enabling said switch means to select said dynamic detection voltage level as said data detection level for transmission;

a second counter having a clock terminal coupled to receive said clock and a data terminal coupled to receive said second flip-flop signal, for counting said clock signal in response to said second flip-flop signal to generate a second counted signal; and a second comparator for comparing said second counted signal with a second internal value to generate a second comparator signal for resetting operation of said second flip-flop.

5. The circuit of claim 1, wherein said fixed detection level generation means comprises:
- a microprocessor having a memory storing a plurality of preset levels corresponding to a number of tracks in said recording medium, for generating a pulse width modulation signal having a duty cycle corresponding to a preset level selected from said plurality of preset levels, said duty cycle varying from track to track as the transducer means transverses said recording medium; and
- filter means for low-pass filtering said pulse width modulation signal to produce the fixed detection level voltage for each track.

6. A circuit for adjusting a data detection level for processing a read signal of a disk driving device, comprising:
- pulse detection means for detecting an amplitude peak of a read signal reproduced from a recording medium by a transducer head, comparing said read signal with a data detection level, and detecting an amplitude peak corresponding to data among said detected amplitude peaks as output data;
- dynamic detection level generation means for generating a dynamic detection voltage level varying in accordance with an amplitude level of said read signal;
- fixed detection level generation means for generating a fixed detection voltage level having a preset value;
- interval detection means for detecting from said output data generated from said pulse detection means an interval where said transducer head is positioned on said recording medium and for discriminating a servo information interval and a data information interval for each track; and
- switch means for selecting one of the fixed detection voltage level and the dynamic detection voltage level as said data detection level in accordance with an interval detected by said interval detection means.

7. The circuit of claim 6, wherein said switch means selects said fixed detection level voltage as said data detection level when said servo information interval is detected by said interval detection means, and selects said dynamic detection level voltage as said data detection level when said data information interval is detected by said interval detection means.

8. The circuit of claim 7, wherein said servo information interval includes an interval where a sector address mark is written to discriminate different sectors of each track, with each sector followed by said servo information interval and said data information interval.

9. The circuit of claim 7, wherein said dynamic detection level generation means comprises a first resistor connected to receive said read signal and an output terminal for producing said dynamic detection voltage level having an amplitude level varying in accordance with the amplitude level of said read signal, and a second resistor serially connected to said output terminal and a voltage terminal.

10. The circuit of claim 7, wherein said fixed detection level generation means comprises a serially connected first and second resistors having one terminal end coupled to receive a power source voltage, for generating said fixed detection level having said preset value.

11. The circuit of claim 7, wherein said fixed detection level generation means comprises:
- a microprocessor having a memory storing a plurality of preset levels corresponding to a number of tracks on said recording medium, for generating a pulse width modulation signal having a duty cycle corresponding to a preset level selected from said plurality of preset levels, said duty cycle varying from track to track as the transducer head traverses said recording medium; and
- filter means for low-pass filtering said pulse width modulation signal to generate the fixed detection level voltage for each track.

12. The circuit of claim 7, wherein said interval detection means comprises:
- sector address mark detection means coupled to receive said output data, for detecting a direct current gap indicative of a sector address mark from said output data to generate a sector address mark detection signal;
- a first flip-flop for latching a power supply voltage in response to said sector address mark detection signal to generate a first flip-flop signal;
- a first counter having a clock terminal coupled to receive a clock signal in synchronization with said output data and a data terminal coupled to receive said first flip-flop signal, for counting said clock signal in response to said first flip-flop signal to generate a first counted signal;
- a first comparator for comparing said first counted signal with a first internal value to generate a first comparator signal exhibiting a logic low state when said first counted signal reaches said first internal value and exhibiting a logic high state when said first counted signal does not reach said first internal value;
- a second flip-flop for latching said power supply voltage in response to said first comparator signal to generate a second flip-flop signal exhibiting a logic high state for enabling said switch means to select said fixed detection voltage level as said data detection level for transmission, and exhibiting a logic low state for enabling said switch means to select said dynamic detection voltage level as said data detection level for transmission;
- a second counter having a clock terminal coupled to receive said clock and a data terminal coupled to receive said second flip-flop signal, for counting said clock signal in response to said second flip-flop signal to generate a second counted signal; and
- a second comparator for comparing said second counted signal with a second internal value to generate a second comparator signal for resetting operation of said second flip-flop.

13. A circuit for adjusting a data detection level for processing a read signal of a disk driving device, comprising:
- peak detection means for detecting an amplitude peak of a read signal reproduced from a recording medium and generating a pulse signal according to said amplitude peak;
- comparator means for hystersis-comparing said read signal with a data detection level;
- rectifier means for rectifying said read signal and generating a rectified signal;
- data detection means for latching an output of said comparing means by said pulse signal and detecting real data from the detected amplitude peak and generating output data;
- dynamic detection level generation means for generating a dynamic detection level voltage at a level defined by said rectified signal;
- fixed detection level generation means for generating a fixed detection level voltage;

interval detection means for detecting from said output data generated from said data detection means an interval where a transducer head is positioned on said recording medium, and discriminating a servo information interval and a data information interval in each sector contained in each track of said recording medium; and switch means for selecting said fixed detection level voltage as said data detection level for transmission to said comparator means, when said interval detection means detects said servo information interval, and for selecting said dynamic detection level voltage as said data detection level for transmission to said comparator means, when said interval detection means detects said data information interval.

14. The circuit of claim 13, wherein said servo information interval includes an interval where a sector address mark is written to discriminate different sectors of each track, with each sector followed by said servo information interval and said data information interval.

15. The circuit of claim 13, wherein said dynamic detection level generation means comprises a first resistor connected to receive said read signal and an output terminal for producing said dynamic detection voltage level having an amplitude level varying in accordance with the amplitude level of said read signal, and a second resistor serially connected to said output terminal and a voltage terminal.

16. The circuit of claim 13, wherein said fixed detection level generation means comprises a serially connected first and second resistors having one terminal end coupled to receive a power source voltage, for generating said fixed detection level having said preset value.

17. The circuit of claim 13, wherein said fixed detection level generation means comprises:

a microprocessor having a memory storing a plurality of preset levels corresponding to a number of tracks in said recording medium, for generating a pulse width modulation signal having a duty cycle corresponding to a preset level selected from said plurality of preset levels, said duty cycle varying from track to track as the transducer head transverses said recording medium from inner tracks to outer tracks; and filter means for low-pass filtering said pulse width modulation signal to detect the fixed detection level voltage for each track.

18. The circuit of claim 13, wherein said interval detection means comprises:

sector address mark detection means coupled to receive said output data, for detecting a direct current gap indicative of a sector address mark from said output data to generate a sector address mark detection signal;

a first flip-flop for latching a power supply voltage in response to said sector address mark detection signal to generate a first flip-flop signal;

a first counter having a clock terminal coupled to receive a clock signal in synchronization with said output data and a data terminal coupled to receive said first flip-flop signal, for counting said clock signal in response to said first flip-flop signal to generate a first counted signal;

a first comparator for comparing said first counted signal with a first internal value to generate a first comparator signal exhibiting a logic low state when said first counted signal reaches said first internal value and exhibiting a logic high state when said first counted signal does not reach said first internal value;

a second flip-flop for latching said power supply voltage in response to said first comparator signal to generate a second flip-flop signal exhibiting a logic high state for enabling said switch means to select said fixed detection voltage level as said data detection level for transmission, and exhibiting a logic low state for enabling said switch means to select said dynamic detection voltage level as said data detection level for transmission;

a second counter having a clock terminal coupled to receive said clock and a data terminal coupled to receive said second flip-flop signal, for counting said clock signal in response to said second flip-flop signal to generate a second counted signal; and a second comparator for comparing said second counted signal with a second internal value to generate a second comparator signal for resetting operation of said second flip-flop.

19. A data detection level adjusting circuit for processing a read signal of a disk driving device, comprising:

pulse detection means for detecting an amplitude peak of an analog read signal reproduced from a magnetic disk, comparing said analog read signal with a data detection level, and detecting an amplitude peak corresponding to real data among detected amplitude peaks as output data;

dynamic detection level generation means for generating a dynamic detection level voltage having a level varying in correspondence with a level of said analog read signal;

fixed detection level generation means for generating a fixed detection level voltage having a preset level selected from a plurality of preset levels in correspondence with each track of said magnetic disk;

interval detection means for detecting from output data detected from said pulse detection means an interval where a transducer head is positioned on the magnetic disk, and for discriminating a servo information interval and a data information interval of each sector contained in each track of the magnetic disk; and switch means for selecting one of the fixed detection level voltage and the dynamic detection level voltage in accordance with an interval detected by said interval detection means and providing the selected voltage as said data detection level.

20. The circuit of claim 19, wherein said switch means selects said fixed detection level voltage as said data detection level when said servo information interval is detected by said interval detection means, and selects said dynamic detection level voltage as said data detection level when said data information interval is detected by said interval detection means.

21. A method for processing a read signal of a disk driving device, comprising the steps of:

detecting an amplitude peak of an analog read signal reproduced from a magnetic disk;

comparing said analog read signal with a data detection level to determine an amplitude peak corresponding to data among detected amplitude peaks as output data;

generating a dynamic detection level voltage having a level varying in correspondence with a level of said analog read signal;

generating a fixed detection level voltage having a preset level selected from a plurality of preset levels in correspondence with each track of said magnetic disk;

detecting from said output data an interval where a transducer head is positioned over said magnetic disk to discriminate a servo information interval and a data information interval of each sector contained in each track of said magnetic disk; and selecting one of the fixed detection level voltage and the dynamic detection level voltage in accordance with an interval detected as said data detection level for determination of said output data.

22. The method of claim 21, further comprised of said data selection level corresponding to said fixed detection level voltage upon detection of said servo information interval, and alternatively corresponding to said dynamic detection level voltage upon detection of said data information interval.

* * * * *